United States Patent
Kang

(10) Patent No.: US 12,002,827 B2
(45) Date of Patent: Jun. 4, 2024

(54) IMAGE SENSOR PACKAGE

(71) Applicant: SAMSUNG ELECTRONICS CO., LTD., Suwon-si (KR)

(72) Inventor: Dong Hoon Kang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 483 days.

(21) Appl. No.: 17/398,503

(22) Filed: Aug. 10, 2021

(65) Prior Publication Data

US 2022/0149095 A1  May 12, 2022

(30) Foreign Application Priority Data

Nov. 11, 2020 (KR) .................. 10-2020-0149951

(51) Int. Cl.
*H01L 21/00* (2006.01)
*H01L 27/146* (2006.01)

(52) U.S. Cl.
CPC .. *H01L 27/14618* (2013.01); *H01L 27/14621* (2013.01); *H01L 27/14627* (2013.01); *H01L 27/14636* (2013.01); *H01L 27/14645* (2013.01); *H01L 27/14683* (2013.01)

(58) Field of Classification Search
CPC ......... H01L 27/14618; H01L 27/14621; H01L 27/14627; H01L 27/14636; H01L 27/14645; H01L 27/14683
See application file for complete search history.

(56) References Cited

U.S. PATENT DOCUMENTS

| | | |
|---|---|---|
| 9,653,504 B1 | 5/2017 | Lin et al. |
| 9,899,442 B2 | 2/2018 | Katkar |
| 10,418,395 B2 | 9/2019 | Chiu |
| 10,418,396 B1 | 9/2019 | Wu |
| 10,615,212 B2 | 4/2020 | Jung et al. |
| 2005/0236684 A1* | 10/2005 | Chen .................. H01L 31/0203 257/E31.117 |

(Continued)

FOREIGN PATENT DOCUMENTS

| | | |
|---|---|---|
| KR | 10-1020876 | 3/2011 |
| KR | 10-1522758 | 5/2015 |
| KR | 10-2019-0143584 | 12/2019 |

*Primary Examiner* — Richard A Booth
(74) *Attorney, Agent, or Firm* — F. CHAU & ASSOCIATES, LLC

(57) ABSTRACT

An image sensor package includes: an image sensor chip that includes first and second faces that are opposite to each other and includes side walls that connect the first and second faces; a mold layer disposed on the side walls of the image sensor chip and that includes third and fourth faces that are opposite to each other; a transparent substrate disposed on the second face of the image sensor chip and spaced apart from the image sensor chip in a first direction, the transparent substrate including a first portion that overlaps the image sensor chip in the first direction and a second portion that does not overlap the image sensor chip in the first direction; and an adhesive layer disposed between the mold layer and the second portion of the transparent substrate, wherein the side walls of the image sensor chip overlap the mold layer in a second direction intersecting the first direction and the fourth face of the mold layer does not overlap the image sensor chip in the first direction.

20 Claims, 16 Drawing Sheets

(56) References Cited

U.S. PATENT DOCUMENTS

| | | | |
|---|---|---|---|
| 2006/0006486 A1* | 1/2006 | Seo | H04N 23/54 |
| | | | 257/E31.118 |
| 2006/0086899 A1* | 4/2006 | Chao | H01L 31/0203 |
| | | | 257/E31.117 |
| 2019/0363121 A1 | 11/2019 | Chiu | |
| 2020/0098808 A1 | 3/2020 | Wu et al. | |

* cited by examiner

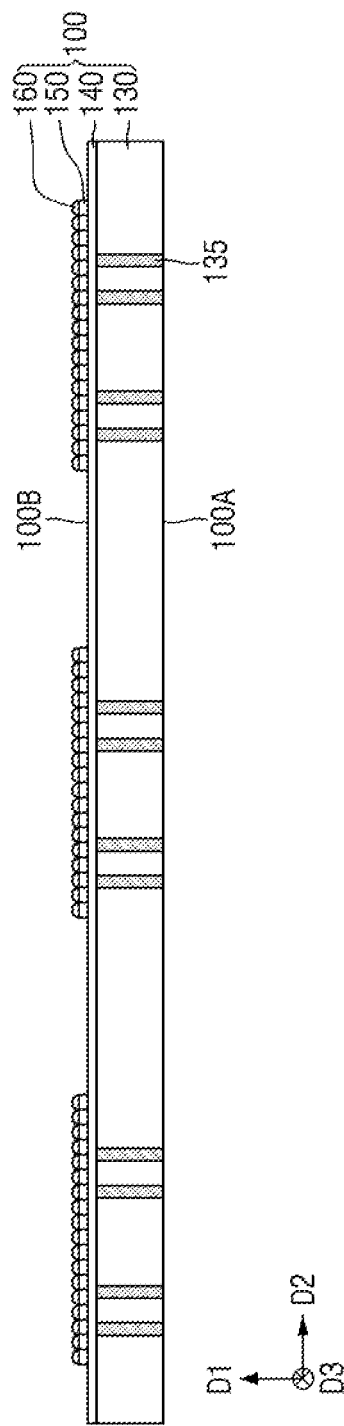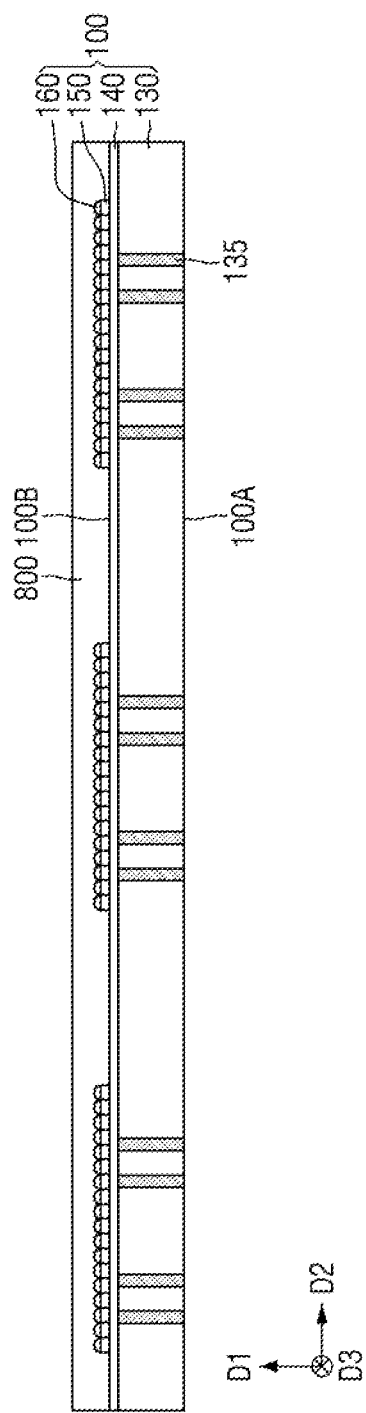

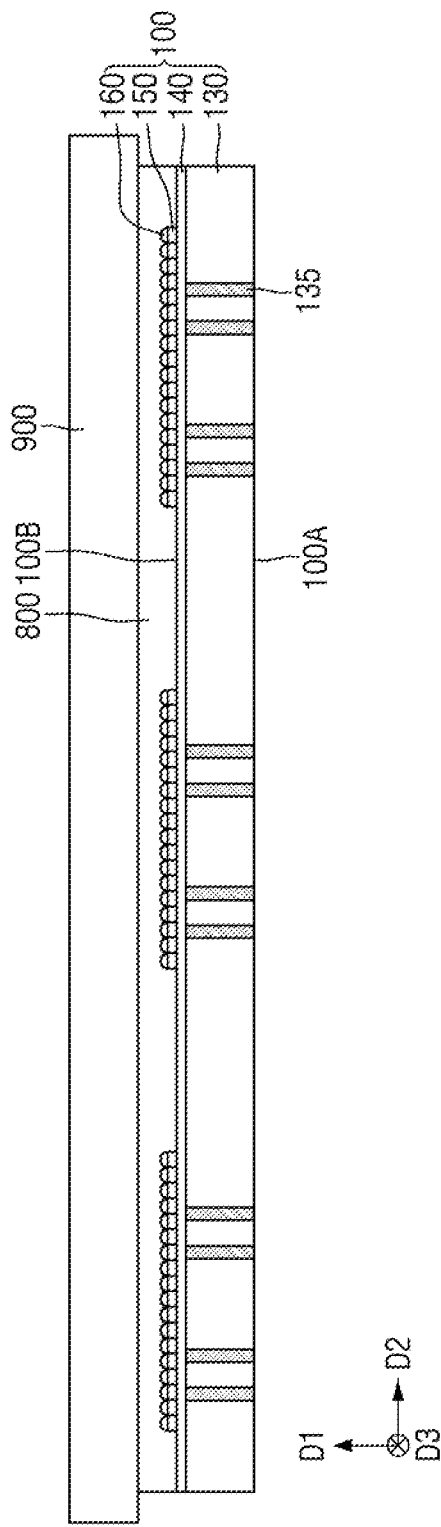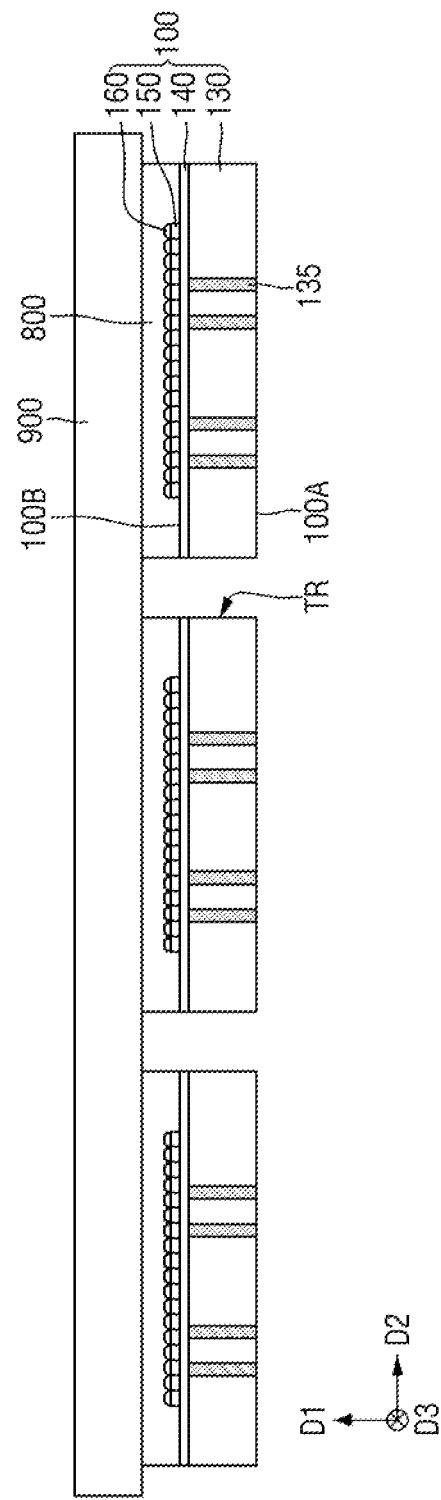

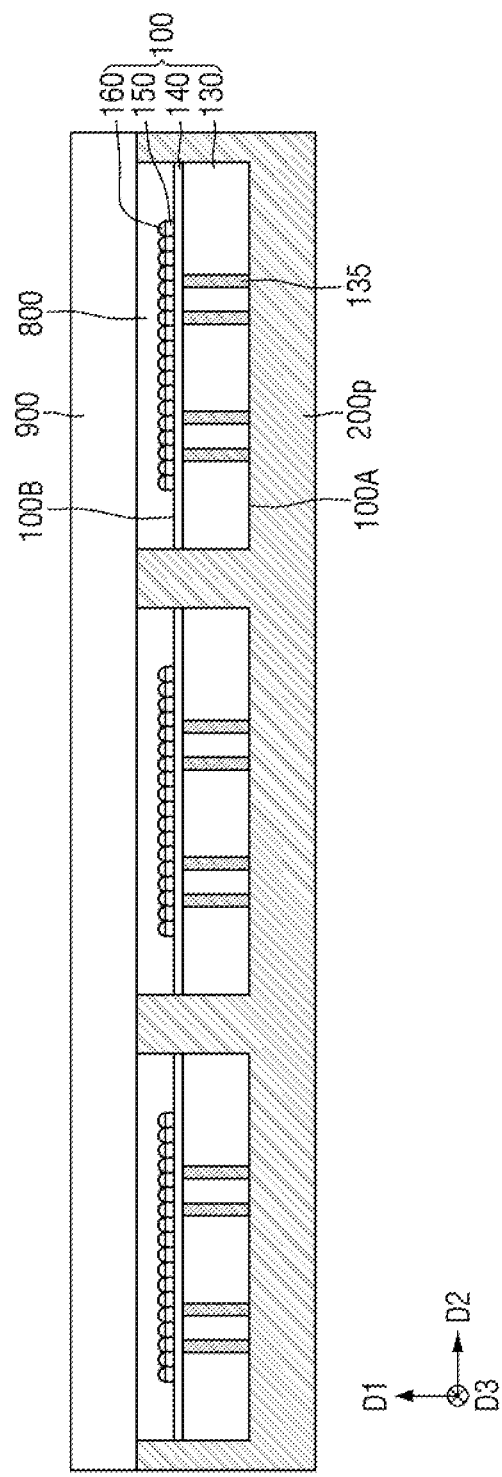

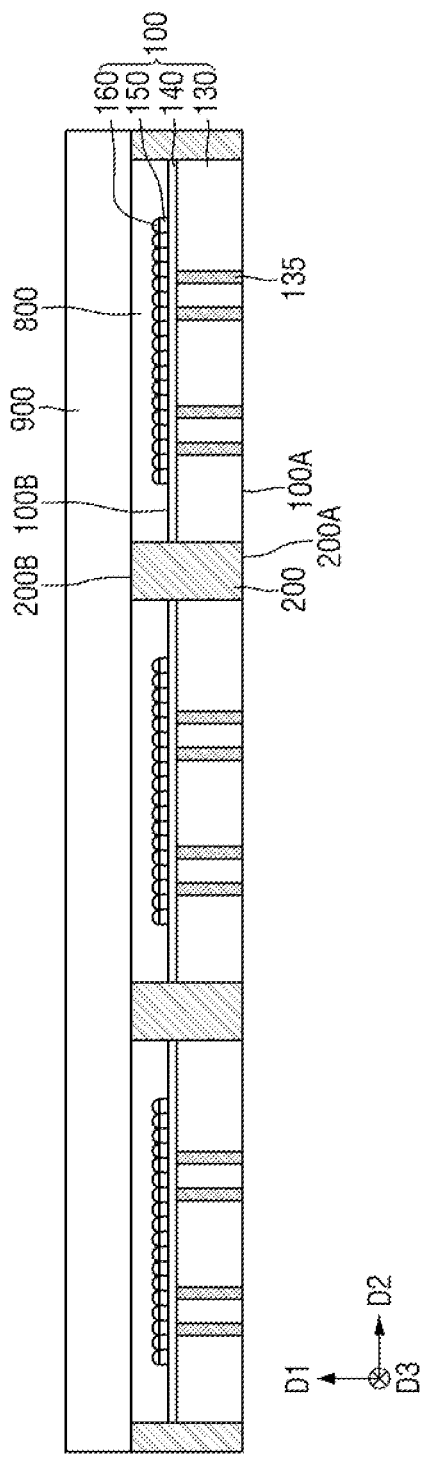

IMAGE SENSOR PACKAGE

CROSS-REFERENCE TO RELATED APPLICATIONS

This application claims priority under 35 U.S.C. § 119 to Korean Patent Application No. 10-2020-0149951 filed on Nov. 11, 2020 in the Korean Intellectual Property Office, the disclosure of which is incorporated by reference herein in its entirety.

TECHNICAL FIELD

Embodiments of the present inventive concept relate to an image sensor package, and more specifically, to a transparent substrate disposed on a mold layer and an adhesive layer.

DISCUSSION OF RELATED ART

An image sensor is a semiconductor device that converts optical information into an electric signal. Examples of image sensors include a charge coupled device (CCD) image sensor and a complementary metal-oxide semiconductor (CMOS) image sensor.

An image sensor may be configured in a package. An image sensor package may be configured as a structure which protects the image sensor and allows light to enter a photo receiving surface or a sensing area of the image sensor.

SUMMARY

According to an embodiment of the inventive concept, an image sensor package includes: an image sensor chip that includes first and second faces that are opposite to each other, the image sensor chip including side walls that connect the first and second faces; a mold layer disposed on the side walls of the image sensor chip and that includes third and fourth faces that are opposite to each other; a transparent substrate disposed on the second face of the image sensor chip and spaced apart from the image sensor chip in a first direction, the transparent substrate including a first portion that overlaps the image sensor chip in the first direction and a second portion that does not overlap the image sensor chip in the first direction; and an adhesive layer disposed between the mold layer and the second portion of the transparent substrate, wherein the side walls of the image sensor chip overlap the mold layer in a second direction intersecting the first direction and the fourth face of the mold layer does not overlap the image sensor chip in the first direction.

According to an embodiment of the present inventive concept, an image sensor package includes: a solder resist layer that wraps around a redistribution layer and a connection pad; a mold layer disposed on the solder resist layer and including an inner wall and an outer wall opposite to the inner wall, the inner wall of the mold layer defining a sensor array region; an image sensor chip disposed on the solder resist layer and in the sensor array region, and contacting the mold layer; a transparent substrate spaced apart from the image sensor chip in a first direction; and an adhesive layer disposed between the transparent substrate and the mold layer, wherein the mold layer includes a third face and a fourth face that are opposite to each other and that connect the inner wall of the mold layer and the outer wall of the mold layer, and the fourth face of the mold layer does not overlap the image sensor chip in the first direction.

According to an embodiment of the present inventive concept, an image sensor package includes: an image sensor chip that includes a first face on which a redistribution layer is formed and a second face that is opposite to the first face and on which a photoelectric conversion layer is formed, the image sensor chip including side walls that connect the first and second faces; a solder resist layer disposed on the first face of the image sensor chip and that wraps around the redistribution layer and a connection pad on the redistribution layer; a mold layer disposed on the side walls of the image sensor chip and that includes a third face placed on a same plane as the first face of the image sensor chip and a fourth face opposite to the third face; a transparent substrate disposed on the second face of the image sensor chip and that is spaced apart from the image sensor chip in a first direction, the transparent substrate including a first portion that overlaps the image sensor chip in the first direction and a second portion that does not overlap the image sensor chip in the first direction; an adhesive layer placed between the second portion of the transparent substrate and the fourth face of the mold layer; and a solder bump disposed on the connection pad and electrically connected to the redistribution layer and the connection pad, wherein the image sensor chip includes a first substrate layer including a through electrode and a second substrate layer placed on the first substrate layer and including the photoelectric conversion layer, wherein the through electrode penetrates the first substrate layer and electrically connects the redistribution layer and the photoelectric conversion layer, wherein the side walls of the image sensor chip overlap the mold layer in a second direction intersecting the first direction, and wherein the fourth face of the mold layer does not overlap the first substrate layer in the first direction.

BRIEF DESCRIPTION OF THE DRAWINGS

The above and other features of the inventive concept will become more apparent by describing in detail embodiments thereof with reference to the accompanying drawings, in which:

FIGS. 8 to 19 are intermediate stage diagrams illustrating a method for fabricating an image sensor package according to embodiments of the present inventive concept.

Figure 1:
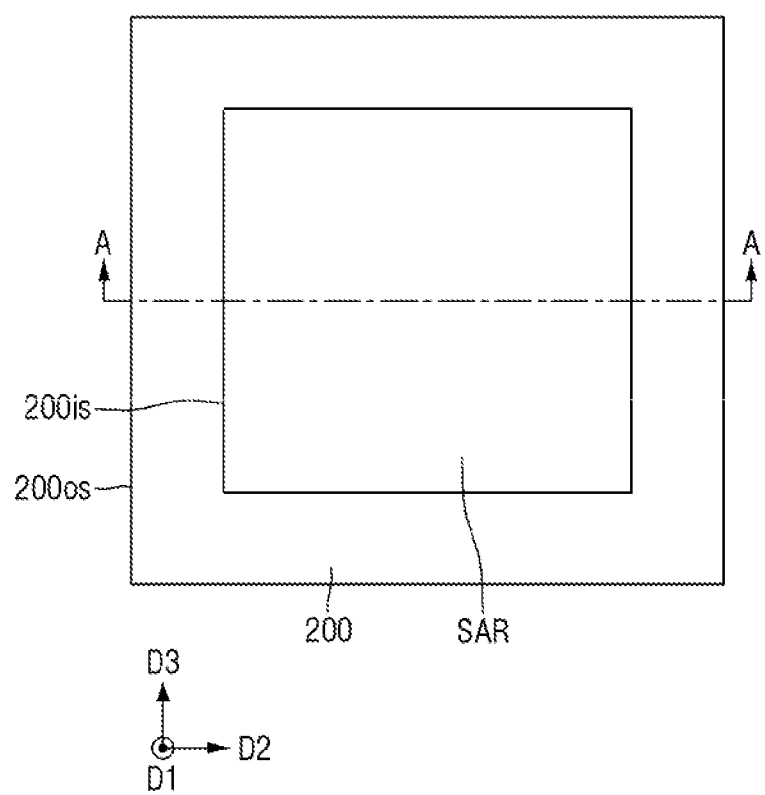
FIG. 1 is a plan view of an image sensor package according to an embodiment of the present inventive concept.

It should be noted that these figures are intended to illustrate the general characteristics of methods, structure, and/or materials used in certain embodiments and to supplement the written description provided below. The drawings are not, however, to scale and may not precisely reflect the precise structural or performance characteristics of any given embodiment, and should not be interpreted as defining or limiting the range of values or properties encompassed by embodiments. For example, the relative thickness and positioning of modules, layers, regions, and/or structural elements may be reduced or exaggerated for clarity. The use of similar reference numbers in the various drawings is intended to indicate the presence of a similar or identical element or feature.

DETAILED DESCRIPTION

Embodiments of the present inventive concept will be described more fully hereinafter with reference to the accompanying drawings. Like reference numerals may refer to like elements throughout the accompanying drawings.

It will be understood that when a component, such as a film, a region, a layer, or an element, is referred to as being "on", "connected to", "coupled to", or "adjacent to" another component, it can be directly on, connected, coupled to, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the component. Other words to use to describe the relationship between elements should be interpreted in a like fashion.

It will be understood that, although the terms "first", "second", etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of embodiments.

Spatially relative terms, such as "beneath", "below", "lower", "above", "upper", and the like may be used herein for ease of description to describe one element or feature's relationship to another element(s) or feature(s) as illustrated in the figures. It will be understood that the spatially relative terms are intended to encompass different orientations of the package in use or operation in addition to the orientation depicted in the figures. For example, if the package in the figures is turned over, elements described as "below" or "beneath" other elements or features would then be oriented "above" the other elements or features. Thus, the exemplary term "below" can encompass both an orientation of above and below. The package may be otherwise oriented (rotated 90 degrees or at other orientations) and the spatially relative descriptors used herein interpreted accordingly.

As used herein, the singular forms "a", "an", and "the" are intended to include the plural forms as well, unless the context clearly indicates otherwise.

Embodiments of the present inventive concept are described herein with reference to cross-sectional illustrations that are schematic illustrations of idealized embodiments (and intermediate structures) of embodiments. As such, variations from the shapes of the illustrations as a result, for example, of manufacturing techniques and/or tolerances, are to be expected. Thus, embodiments of the present inventive concept should not be construed as limited to the particular shapes of regions illustrated herein but are to include deviations in shapes that result, for example, from manufacturing, as would be understood by a person having ordinary skill in the art.

FIG. 1 is a plan view of an image sensor package according to an embodiment of the present inventive concept.

Referring to FIG. 1, an image sensor package according to an embodiment of the present inventive concept may include a mold layer 200 including an inner wall 200is and an outer wall 200os opposite to the inner wall 200is.

The inner wall 200is of the mold layer 200 may define a sensor array region SAR. An image sensor chip (e.g., 100 of FIG. 2) may be disposed inside the sensor array region SAR. The mold layer 200 may be formed along the periphery of the sensor array region SAR.

Although not shown in FIG. 1, an adhesive layer (e.g., 300 of FIG. 2) may be formed on the mold layer 200. A transparent substrate (e.g., 400 of FIG. 2) that covers the adhesive layer and the sensor array region SAR may be formed on the adhesive layer and the sensor array region SAR.

The sensor array region SAR may include a region corresponding to an active pixel sensor array. For example, a plurality of unit pixels disposed two-dimensionally (for example, in the form of a matrix) may be formed in the sensor array region SAR.

Although it is not shown, the sensor array region SAR may include a photo receiving region and a photo shielding region. Active pixels that receive light and generate an active signal may be arranged in the photo receiving region. Optical black pixels that shield light and generate an optical black signal may be arranged in the photo shielding region. Although the photo shielding region may be formed, for example, along the periphery of the photo receiving region, the present inventive concept is not limited as such.

Figure 2:
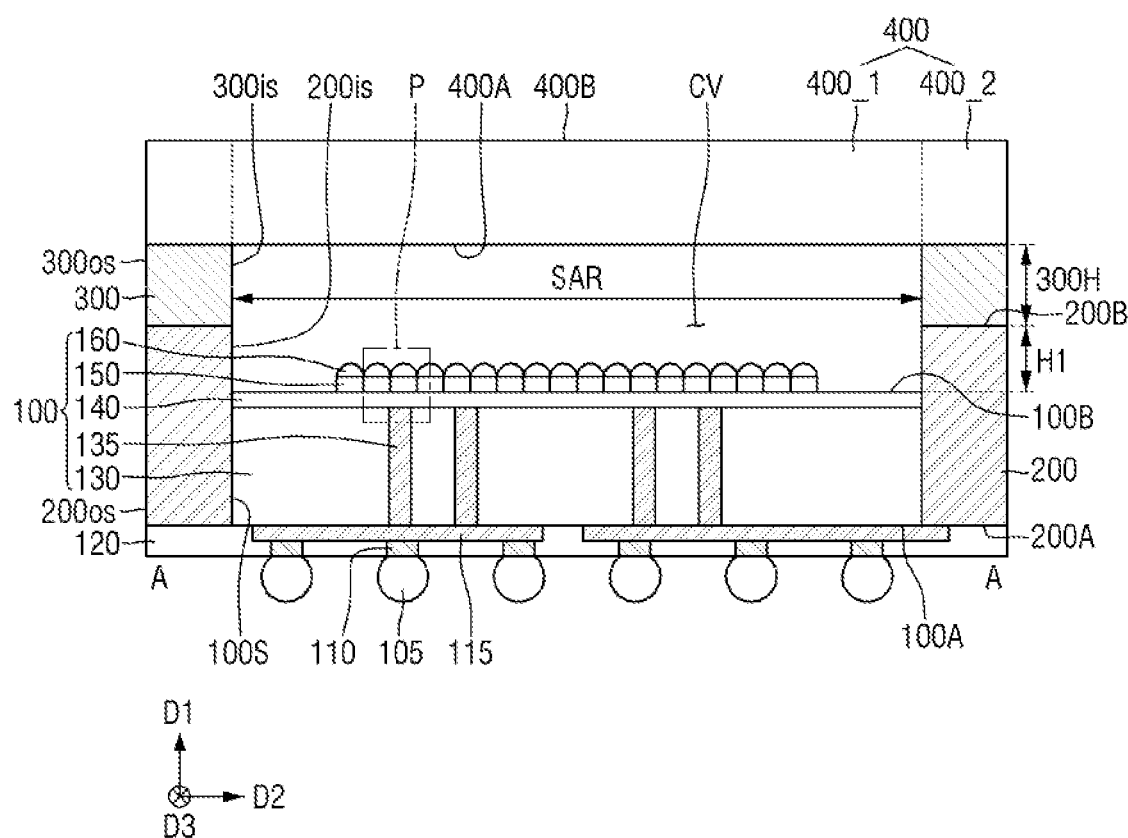
FIG. 2 is a cross-sectional view taken along a line A-A of FIG. 1.
Figure 3:
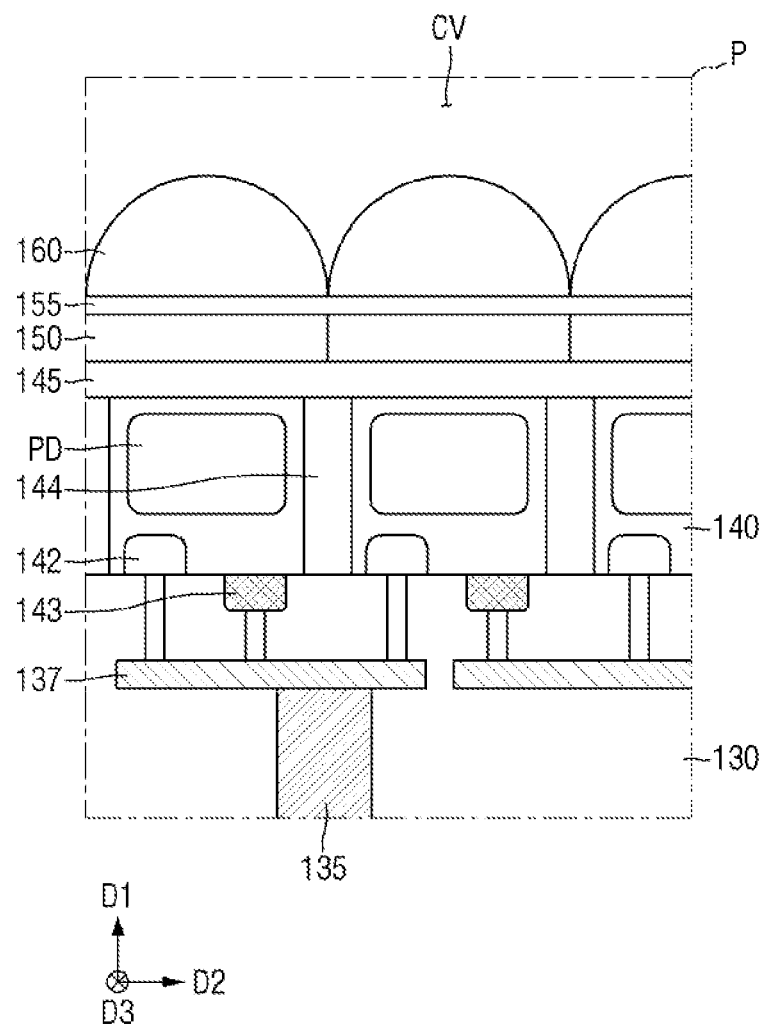
FIG. 3 is an enlarged view of a region P of FIG. 2.

FIG. 2 is a cross-sectional view taken along a line A-A of FIG. 1. FIG. 3 is an enlarged view of a region P of FIG. 2.

Referring to FIGS. 2 and 3, an image sensor package according to an embodiment of the present inventive concept may include an image sensor chip 100, a solder resist layer 120, a mold layer 200, an adhesive layer 300, and a transparent substrate 400.

The image sensor chip 100 may include a first face 100A and a second face 100B that are opposite to each other. The first face 100A and the second face 100B may be parallel to each other. The first face 100A and the second face 100B may not intersect each other.

The first face 100A may be a lower face of the image sensor chip 100 in a first direction D1. The second face 100B may be an upper face of the image sensor chip 100 in the first direction D1. The first direction D1 may be, for example, perpendicular to the first face 100A and the second face 100B.

The image sensor chip 100 may include a side wall 100S that connects the first face 100A and the second face 100B. The side wall 100S of the image sensor chip 100 may be aligned with the first direction D1. That is, the side wall 100S of the image sensor chip 100 may have a linear shape.

A redistribution layer 115 and a solder resist layer 120 may be disposed on the first face 100A of the image sensor chip 100. The solder resist layer 120 and the redistribution layer 115 may be in contact with the first face 100A of the image sensor chip 100.

The image sensor package according to some embodiments may include a connection pad 110 that is in contact with the redistribution layer 115. The image sensor package according to some embodiments may include a solder bump 105 connected to the connection pad 110. The solder bump 105 may electrically connect the connection pad 110 and the redistribution layer 115.

The solder resist layer 120 may wrap around the redistribution layer 115 and the connection pad 110. The solder resist layer 120 may not wrap around the solder bump 105. That is, the solder bump 105 may protrude from the lower face of the solder resist layer 120 in the first direction D1.

The solder bump 105 may include a substance included in a solder material. For example, the solder bump 105 may include, but is not limited to, at least one of lead (Pb), tin (Sn), indium (In), bismuth (Bi), antimony (Sb), silver (Ag), and alloys thereof.

The solder resist layer 120 may be made of, for example, a passivation substance, such as polyimide. Alternatively, the solder resist layer 120 may be made of, but is not limited to, for example, BCB (benzocyclobutenes), polybenzoxazole, polyimide, epoxy, silicon oxide, silicon nitride, or a combination thereof.

The redistribution layer 115 may include a conductive substance. The redistribution layer 115 may include, but is not limited to, for example, at least one of copper (Cu), aluminum (Al), silver (Ag), tin (Sn), gold (Au), nickel (Ni), lead (Pb), titanium (Ti), and alloys thereof.

The image sensor chip 100 may be disposed on the solder resist layer 120. The image sensor chip 100 may include a first substrate layer 130, a first through electrode 135, a second substrate layer 140, a color filter 150, and a microlens 160.

The first substrate layer 130 may be disposed on the solder resist layer 120. The pixel gate layer 143 may be disposed inside the first substrate layer 130.

The first substrate layer 130 may include, for example, at least one of silicon oxide, silicon nitride, silicon oxynitride, and a low dielectric constant (low-k) substance having a lower dielectric constant than silicon oxide. The low dielectric constant substance may include, but is not limited to, for example, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material, or a combination thereof.

A connection wiring 137 may be disposed inside the first substrate layer 130. The connection wiring 137 may be electrically connected to a storage node region 142, a photoelectric conversion layer PD, and a pixel gate layer 143.

The connection wiring 137 may include a wiring barrier layer and a wiring filling layer. The wiring barrier layer may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh).

The wiring filling layer may include, for example, at least one of aluminum (Al), copper (Cu), tungsten (W), cobalt (Co), ruthenium (Ru), and molybdenum (Mo).

The first through electrode 135 may be formed inside the first substrate layer 130. The first through electrode 135 may penetrate the first substrate layer 130 and electrically connect the connection wiring 137 with the redistribution layer 115. The redistribution layer 115 and the photoelectric conversion layer PD may be electrically connected accordingly.

The second substrate layer 140 may be disposed on the first substrate layer 130. The second substrate layer 140 may be, for example, bulk silicon or SOI (silicon-on-insulator). Alternatively, the second substrate layer 140 may be a silicon substrate or may include other substances, but are not limited to, for example, silicon germanium, SGOI (silicon germanium on insulator), indium antimonide, lead tellurium compounds, indium arsenic, indium phosphorus, gallium arsenide, or gallium antimonide.

The storage node region 142 may be formed inside the second substrate layer 140. The storage node region 142 may be disposed apart from the photoelectric conversion layer PD. The storage node region 142 may include impurities of conductivity type different from the second substrate layer 140. The storage node region 142 may be a region corresponding to a floating diffusion region.

The photoelectric conversion layer PD may be disposed inside the second substrate layer 140. The photoelectric conversion layer PD may generate a light charge in proportion to an amount of light incident from the outside. The photoelectric conversion layer PD may receive light and convert an optical signal into an electric signal. The photoelectric conversion layer PD may be formed by doping impurities in the second substrate layer 140.

For example, there may be a concentration difference in impurities between an upper part and a lower part of the photoelectric conversion layer PD so that the photoelectric conversion layer PD may have a potential gradient. For example, the photoelectric conversion layer PD may be formed in a stacked form of a plurality of impurity regions.

A pixel separation region 144 may be disposed to surround the photoelectric conversion layer PD. Although the pixel separation region 144 is shown to extend from the lower face to the upper face of the second substrate layer 140, this is only for convenience of explanation, and embodiments are not limited thereto. The pixel separation region 144 may prevent the light charges generated in a specific pixel by incident light from moving to the adjacent pixel region by a random drift. Further, the pixel separation region 144 may refract incident light that is obliquely incident on the photoelectric conversion layer PD.

A first flattening film 145 may be disposed on the second substrate layer 140. The first flattening film 145 may include an insulating substance. Further, the first flattening film 145 may include, for example, a silicon oxide film. Unlike the shown configuration, in some embodiments of the present inventive concept, the first flattening film 145 may be omitted.

A color filter 150 may be disposed on the first flattening film 145. The color filter 150 may be disposed on the photoelectric conversion layer PD. The color filter 150 may allow light of a specific wavelength to pass and reach the lower photoelectric conversion layer PD. The color filter 150 may be implemented, for example, as a color filter array including at least one of a red (R) filter, a green (G) filter, and a blue (B) filter. The color filter 150 may be made up of, for example, a substance obtained by mixing a resin with a pigment including a metal or a metal oxide.

A second flattening film 155 may be disposed on the color filter 150. The second flattening film 155 may include an insulating substance, for example, a silicon oxide.

The microlens 160 may change the path of light incident on a region other than the photoelectric conversion layer PD and concentrate the light into the photoelectric conversion layer PD. The microlens 160 may include, but is not limited to, organic substances such as light transmissive resin.

The mold layer 200 may be disposed on the side wall 100S of the image sensor chip 100, on the solder resist layer 120. The mold layer 200 may include an inner wall 200is that is in contact with the side wall 100S of the image sensor chip 100, and an outer wall 200os opposite to the inner wall 200is.

The side wall 100S of the image sensor chip 100 may overlap the mold layer 200 in the second direction D2. The second direction D2 may intersect the first direction D1. For example, the second direction D2 may be perpendicular to the first direction D1.

The mold layer 200 may include a third face 200A and a fourth face 200B that are opposite to each other. The third face 200A in the first direction D1 may be, for example, a lower face of the mold layer 200 in the first direction D1. The fourth face 200B may be, for example, an upper face of the mold layer 200 in the first direction D1.

The inner wall 200is of the mold layer 200 may connect the third face 200A of the mold layer 200 and the fourth face 200B of the mold layer 200. Similarly, the outer wall 200os of the mold layer 200 may connect the third face 200A of the mold layer 200 and the fourth face 200B of the mold layer 200. The inner wall 200is and the outer wall 200os of the mold layer 200 may be aligned with the first direction D1 and perpendicular to the second direction D2.

The third face 200A of the mold layer 200 may be in contact with the solder resist layer 120. The third face 200A of the mold layer 200 may be disposed on a same plane as the first face 100A of the image sensor chip 100.

The fourth face 200B of the mold layer 200 may be disposed on a plane different from the second face 100B of the image sensor chip 100. Specifically, the second face 100B of the image sensor chip 100 may be lower than the fourth face 200B of the mold layer 200.

A height H1 from the second face 100B of the image sensor chip 100 to the fourth face 200B of the mold layer 200 may be 50 μm or more and 200 μm or less. The height H1 from the second face 100B of the image sensor chip 100 to the fourth face 200B of the mold layer 200 may be 100 μm.

A level difference between the image sensor chip 100 and the mold layer 200 may reduce a flare. Further, the level difference between the image sensor chip 100 and the mold layer 200 may reduce a ghost risk.

The mold layer 200 may include, for example, an insulating substance. For example, the mold layer 200 may include a thermosetting resin such as an epoxy resin, a thermoplastic resin such as polyimide, or resins obtained by mixing resins with an inorganic filler or by impregnating resins in core materials such as glass fiber (Glass Cloth, Glass Fabric) together with an inorganic filler (e.g., prepreg, ABF (Ajinomoto Build-up Film), FR-4, and BT (Bismaleimide Triazine)) and the like. Alternatively, the mold layer 200 may also include a photoimageable dielectric (PID).

The transparent substrate 400 may be disposed on the second face 100B of the image sensor chip 100 and spaced apart from the image sensor chip 100 in the first direction D1.

The transparent substrate 400 may include a first portion 400_1 that may overlap the image sensor chip 100 in the first direction D1, and a second portion 400_2 that may not overlap the image sensor chip 100 in the first direction D1. The second portion 400_2 of the transparent substrate 400 may overlap the mold layer 200 in the first direction D1.

The transparent substrate 400 may include a fifth face 400A facing the second face 100B of the image sensor chip 100, and a sixth face 400B opposite to the fifth face 400A. In the first direction D1, the fifth face 400A of the transparent substrate 400 may be, for example, a lower face of the transparent substrate 400. In the first direction D1, the sixth face 400B of the transparent substrate 400 may be, for example, an upper face of the transparent substrate 400.

In some embodiments, the transparent substrate 400 may be a glass substrate. In another embodiment, the transparent substrate 400 may also be a plastic substrate.

The adhesive layer 300 may be disposed on the mold layer 200. The adhesive layer 300 may be disposed between the mold layer 200 and the transparent substrate 400. Specifically, the adhesive layer 300 may be disposed between the mold layer 200 and the second portion 400_2 of the transparent substrate 400.

The adhesive layer 300 may be in contact with the fourth face 200B of the mold layer 200. Also, the adhesive layer 300 may be in contact with the second portion 400_2 of the transparent substrate 400.

The adhesive layer 300 may include an inner wall 300is, and an outer wall 300os opposite to the inner wall 300is. The inner wall 300is of the adhesive layer 300 may be disposed on the same plane as the inner wall 200is of the mold layer 200. Similarly, the outer wall 300os of the adhesive layer may be disposed on the same plane as the outer wall 200os of the mold layer 200.

The adhesive layer 300 may include, for example, a curable polymer. The adhesive layer 300 may include, for example, an epoxy-based polymer.

An image sensor package according to an embodiment of the present inventive concept may include a cavity CV. The cavity CV may be defined by the fifth face 400A of the transparent substrate 400, the second face 100B of the image sensor chip 100, the inner wall 200is of the mold layer 200, and the inner wall 300is of the adhesive layer 300. The cavity CV may be filled with air. The microlens 160 may be disposed inside the cavity CV.

Figure 4:
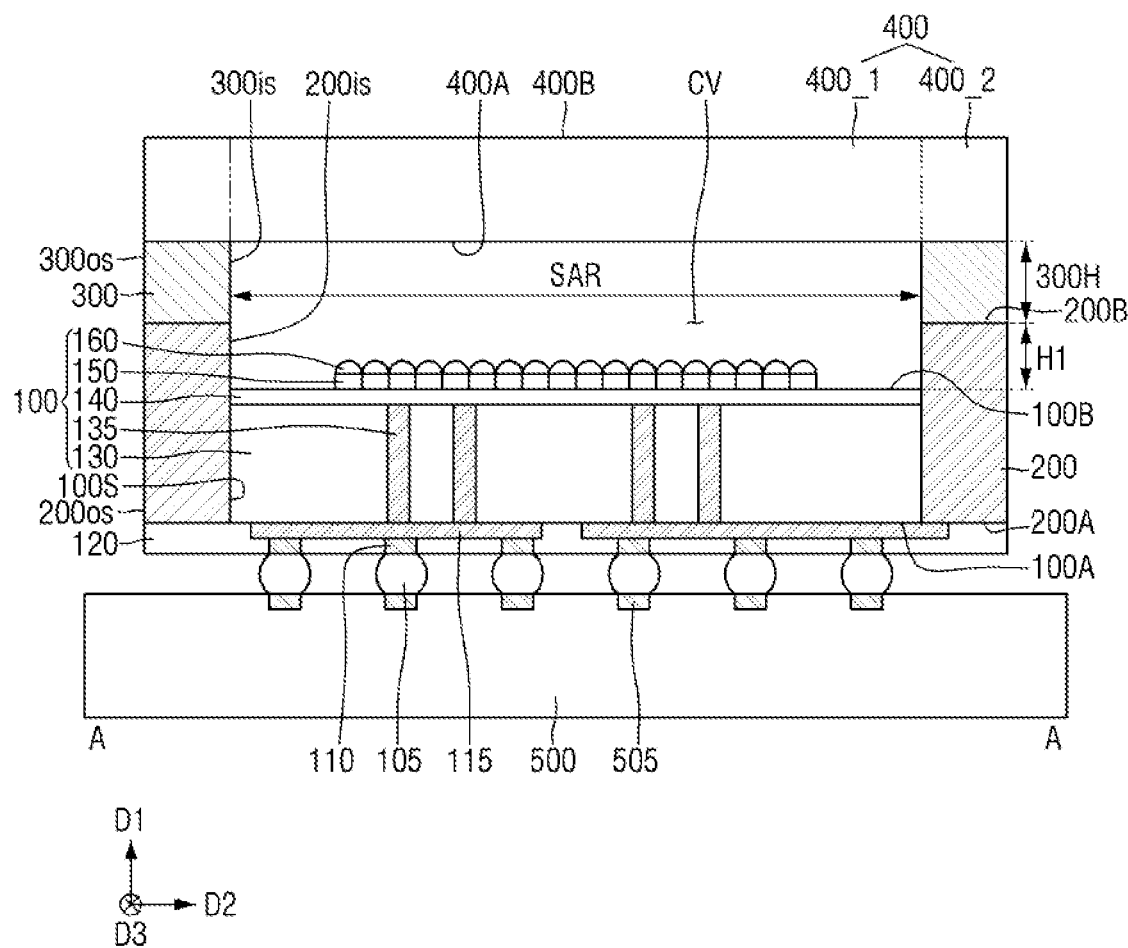
FIG. 4 is a cross-sectional view of an image sensor package according to an embodiment of the present inventive concept.

FIG. 4 is a cross-sectional view of an image sensor package according to an embodiment of the present inventive concept. For convenience, differences from components described with reference to FIGS. 1 to 3 will be mainly described.

Referring to FIG. 4, an image sensor package according to an embodiment of the present inventive concept may further include a first semiconductor chip 500.

The first semiconductor chip 500 may be disposed on the first face 100A of the image sensor chip 100 and spaced apart from the first face 100A of the image sensor chip 100 in the first direction D1. The solder resist layer 120 and the solder bump 105 may be disposed between the first semiconductor chip 500 and the image sensor chip 100.

The first semiconductor chip 500 may include a chip pad 505. The solder bump 105 may be disposed on the chip pad 505. The first semiconductor chip 500 may be electrically connected to the image sensor chip 100 through the solder bump 105.

The first semiconductor chip 500 may include, for example, a PCB substrate. Further, the first semiconductor chip 500 may include, for example, a memory element, a digital signal process integrated circuit, an application specific integrated circuit, and a driver.

Figure 5:
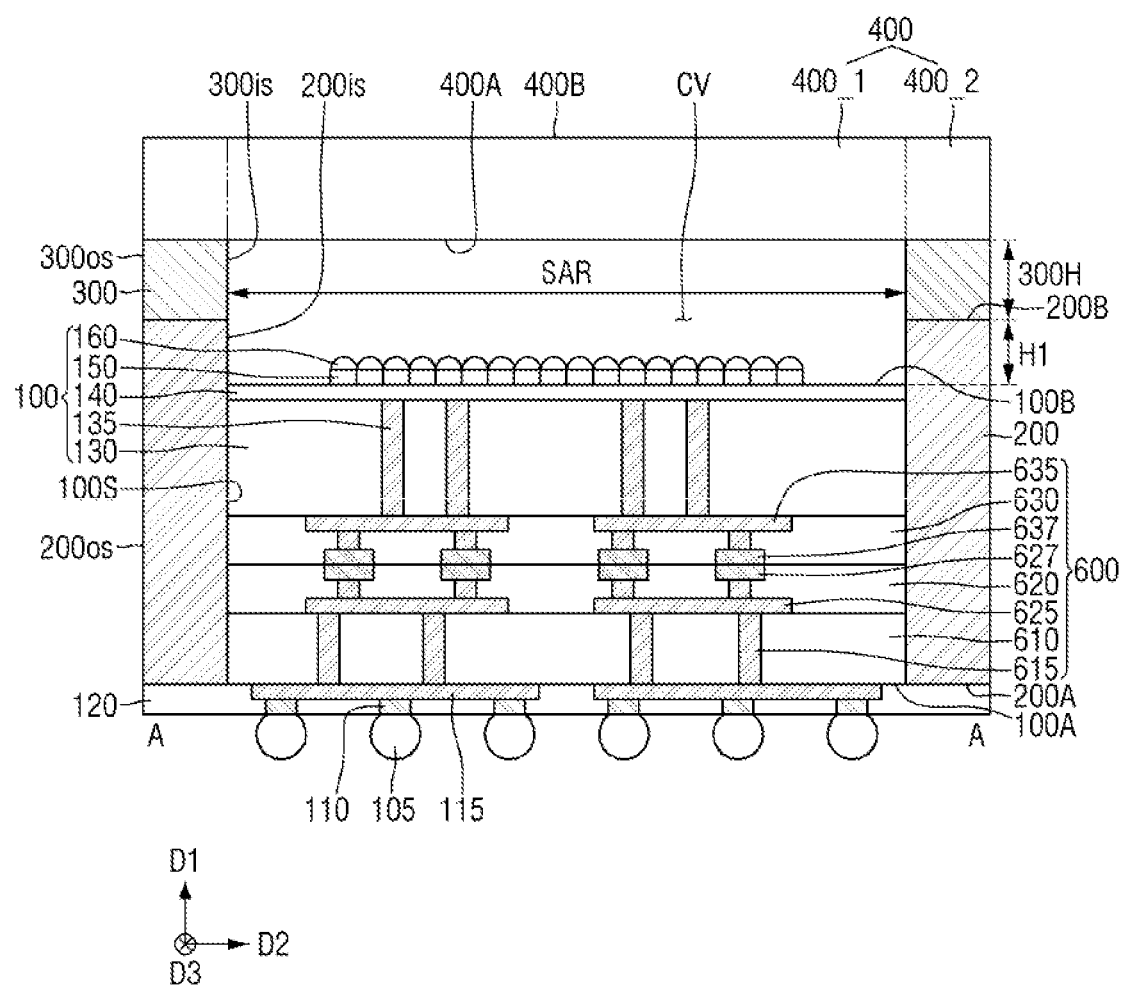
FIG. 5 is a cross-sectional view of an image sensor package according to an embodiment of the present inventive concept.

FIG. 5 is a cross-sectional view of an image sensor package according to an embodiment of the present inventive concept. For convenience, differences from the components described with reference to FIGS. 1 to 3 will be mainly described.

Referring to FIG. 5, an image sensor package according to an embodiment of the present inventive concept may further include a second semiconductor chip 600.

The second semiconductor chip 600 may be a logic chip that converts light detected from an image sensor chip 100 into an electric signal.

The second semiconductor chip 600 may be disposed on the solder resist layer 120. The second semiconductor chip 600 may include a semiconductor substrate layer 610, a first wiring insulation layer 620, and a second wiring insulation layer 630.

The semiconductor substrate layer 610 may be disposed on the solder resist layer 120. The semiconductor substrate layer 610 may include a second through electrode 615. The second through electrode 615 may penetrate the semiconductor substrate layer 610 and be electrically connected to the redistribution layer 115 and the connection pad 110. The second semiconductor chip 600 and the photoelectric conversion layer (e.g., PD of FIG. 3) may be electrically connected accordingly.

The semiconductor substrate layer 610 may be, for example, bulk silicon or SOI (silicon-on-insulator). Alternatively, the semiconductor substrate layer 610 may be a silicon substrate, or may include, but is not limited to, for example, other substances such as silicon germanium, SGOI (silicon germanium on insulator), indium antimonide, lead tellurium compounds, indium arsenic, indium phosphorus, gallium arsenide, or gallium antimonide.

The first wiring insulation layer 620 may be disposed on the semiconductor substrate layer 610. A first wiring layer 625 may be formed in the first wiring insulation layer 620. The first wiring insulation layer 620 may wrap around the first wiring layer 625. A first joining pad 627 may be electrically connected to the first wiring layer 625.

A second wiring insulation layer 630 may be disposed on the first wiring insulation layer 620. The second wiring insulation layer 630 may be disposed between the first substrate layer 130 and the first wiring insulation layer 620. A second wiring layer 635 may be formed inside the second wiring insulation layer 630. A second joining pad 637 may be formed inside the second wiring insulation layer 630. The second joining pad 637 may be electrically connected to the second wiring layer 635.

The first joining pad 627 and the second joining pad 637 may be directly connected to each other. That is, the first joining pad 627 and the second joining pad 637 may be directly bonded.

Each of the first joining pad 627 and the second joining pad 637 may include a pad barrier layer and a pad filling layer. The pad barrier layer may include, for example, at least one of tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), and rhodium (Rh). The pad filling layer may include, for example, copper (Cu).

Figure 6:
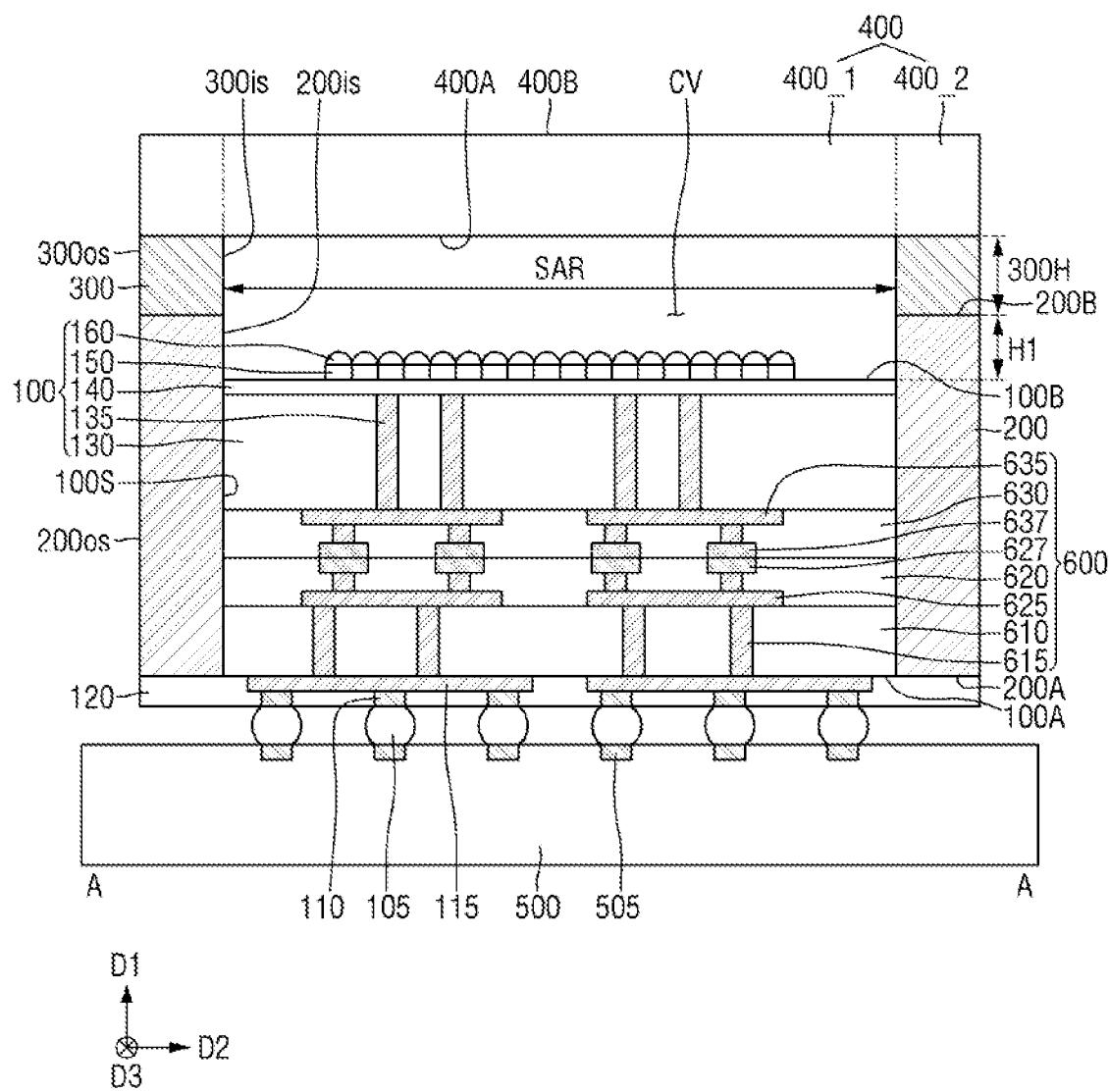
FIG. 6 is a cross-sectional view of an image sensor package according to an embodiment of the present inventive concept.

FIG. 6 is a cross-sectional view of an image sensor package according to an embodiment of the present inventive concept. For convenience, differences from the components described with reference to FIGS. 1 to 5 will be mainly described.

Referring to FIG. 6, an image sensor package according to an embodiment of the present inventive concept may include the first semiconductor chip 500 and the second semiconductor chip 600.

Figure 7:
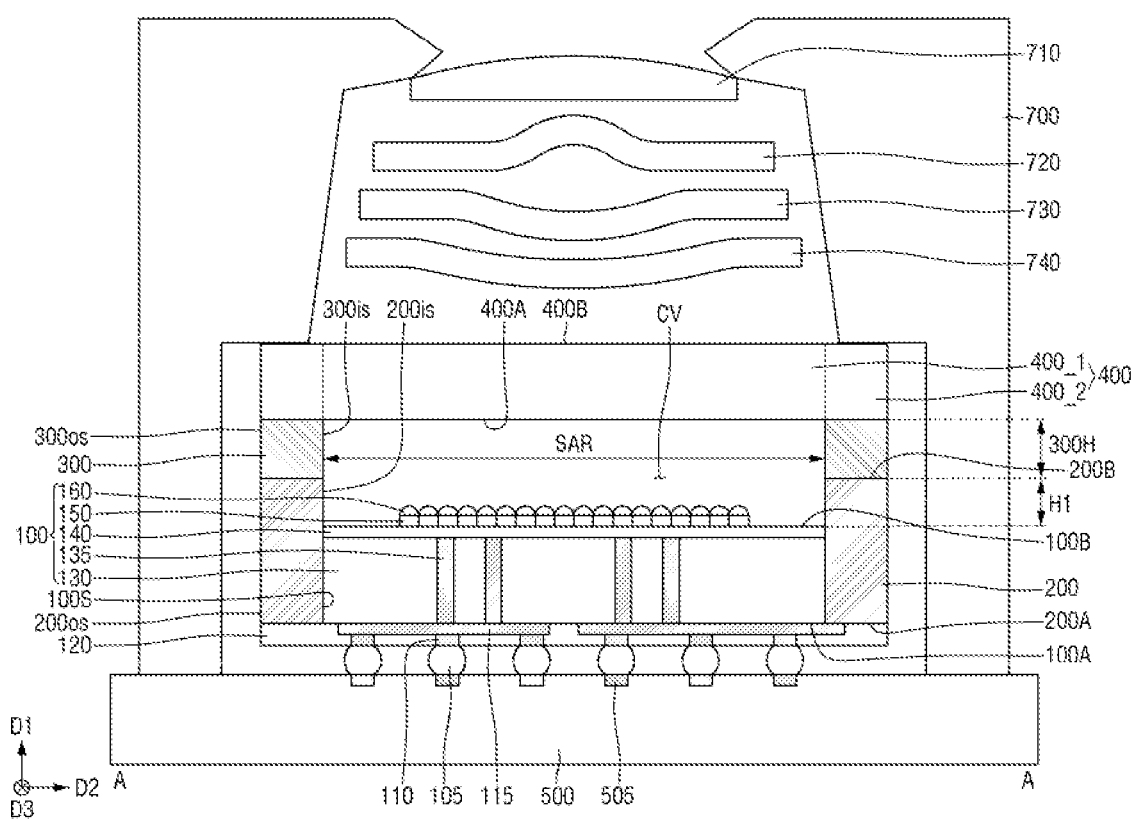
FIG. 7 is a cross-sectional view of a sensor package according to an embodiment of the present inventive concept.

FIG. 7 is a cross-sectional view of an image sensor package according to an embodiment of the present inventive concept. For convenience, differences from the components described with reference to FIGS. 1 to 6 will be mainly described.

Referring to FIG. 7, an image sensor package according to an embodiment of the present inventive concept may include a housing 700.

The housing 700 may wrap around the image sensor chip 100. The housing 700 may protect the image sensor chip 100. The housing 700 may be connected to the first semiconductor chip 500.

The housing 700 may include first to fourth lenses 710, 720, 730, and 740. The first to fourth lenses 710, 720, 730, and 740 may be connected to the housing 700. Light may be transmitted to the image sensor chip 100 through the first to fourth lenses 710, 720, 730, and 740.

Although four lenses are shown, the present inventive concept is not limited thereto. Also, although the second to fourth lenses 720, 730, and 740 are shown to include a curved surface, the present inventive concept is not limited thereto, and the second to fourth lenses may, of course, include a planar surface.

Although not shown, an underfill layer may be included between the first semiconductor chip 500 and the image sensor chip 100. The underfill layer may wrap around the solder bumps 105.

FIGS. 8 to 19 are intermediate stage diagrams illustrating a method for fabricating an image sensor package according to embodiments of the present inventive concept.

Referring to FIG. 8, an image sensor chip 100 that includes a first substrate layer 130 including a plurality of first through electrodes 135 and a second substrate layer 140 disposed on the first substrate layer 130 may be provided.

The image sensor chip 100 may include a first face 100A and a second face 100B that are opposite to each other. The first face 100A may be a lower face of the image sensor chip 100. The second face 100B may be an upper face of the image sensor chip 100.

The image sensor chip 100 may include a color filter 150 and a microlens 160 that are disposed on the second face 100B. A region in which the color filter 150 and the microlens 160 are disposed may be a sensor array region (for example, SAR of FIG. 1).

Referring to FIG. 9, a sacrificial layer 800 may be formed on the second face 100B of the image sensor chip 100.

The lower face of the sacrificial layer 800 may be bonded to the second face 100B of the image sensor chip 100. The sacrificial layer 800 may cover the color filter 150 and the microlens 160. The sacrificial layer 800 may be, for example, a tape substrate.

Referring to FIG. 10, a silicon carrier 900 may be provided.

The silicon carrier 900 may be formed on the sacrificial layer 800. The silicon carrier 900 may be bonded to the sacrificial layer 800. Specifically, the silicon carrier 900 may be bonded to the upper face of the sacrificial layer 800. The silicon carrier 900 may be, for example, a silicon substrate.

Referring to FIG. 11, a trench TR may be formed by etching a part of the image sensor chip 100 and a part of the sacrificial layer 800.

The trench TR may expose the silicon carrier 900.

Subsequently, referring to FIG. 12, a pre mold layer 200p that fills the trench TR and covers the first face 100A of the image sensor chip 100 may be formed.

The pre mold layer 200p may include, for example, an insulating substance. For example, the pre mold layer 200p may include a thermosetting resin such as an epoxy resin, a thermoplastic resin such as polyimide, or resins obtained by mixing resins with an inorganic filler or by impregnating resins in core materials such as glass fiber (Glass Cloth, Glass Fabric) together with an inorganic filler (e.g., prepreg, ABF (Ajinomoto Build-up Film), FR-4, and BT (Bismaleimide Triazine)) and the like. Alternatively, the pre mold layer 200p may also include a photoimageable dielectric (PID).

Subsequently, referring to FIG. 13, the pre mold layer 200p may be ground.

The pre mold layer 200p may be ground to form the mold layer 200. The mold layer 200 may include a third face 200A and a fourth face 200B that are opposite to each other. The third face 200A may be a lower face of the mold layer 200. The fourth face 200B may be an upper face of the mold layer 200. The fourth face 200B of the mold layer 200 may be disposed on the same plane as the upper face of the sacrificial layer 800.

The pre mold layer 200p may be ground to expose the first face 100A of the image sensor chip 100. The third face 200A of the mold layer 200 and the first face 100A of the image sensor chip 100 may be disposed on the same plane.

Figure 14:
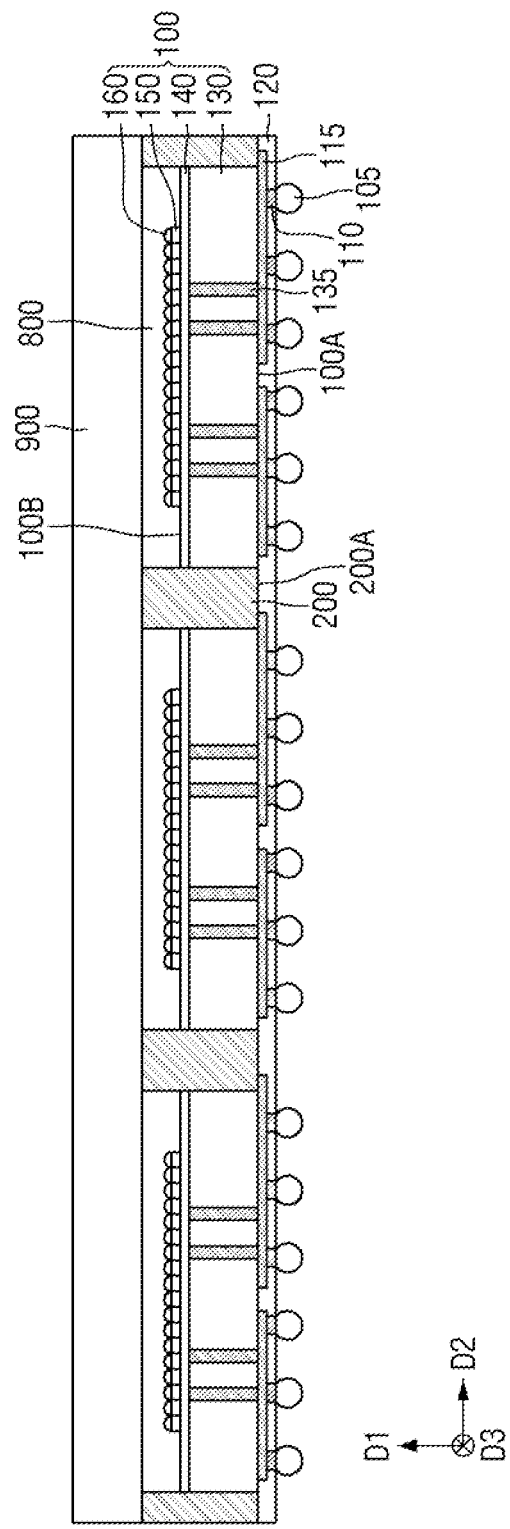

Referring to FIG. 14, a solder resist layer 120, a redistribution layer 115, a connection pad 110, and a solder bump 105 may be formed on the first face 100A of the image sensor chip 100.

First, the redistribution layer 115 may be formed on a part of the first face 100A of the image sensor chip 100.

The redistribution layer 115 may include a conductive substance. The redistribution layer 115 may include, but is not limited to, for example, at least one of copper (Cu), aluminum (Al), silver (Ag), tin (Sn), gold (Au), nickel (Ni), lead (Pb), titanium (Ti), and alloys thereof.

Subsequently, the solder resist layer 120 may be formed. After the solder resist layer 120 is formed, the connection pad 110 may be formed. The solder resist layer 120 may wrap around the redistribution layer 115 and the connection pad 110.

Subsequently, the solder bump 105 may be formed on the connection pad 110. The solder bump 105 may electrically connect the connection pad 110 and the redistribution layer 115 to the first through electrode 135.

Figure 15:
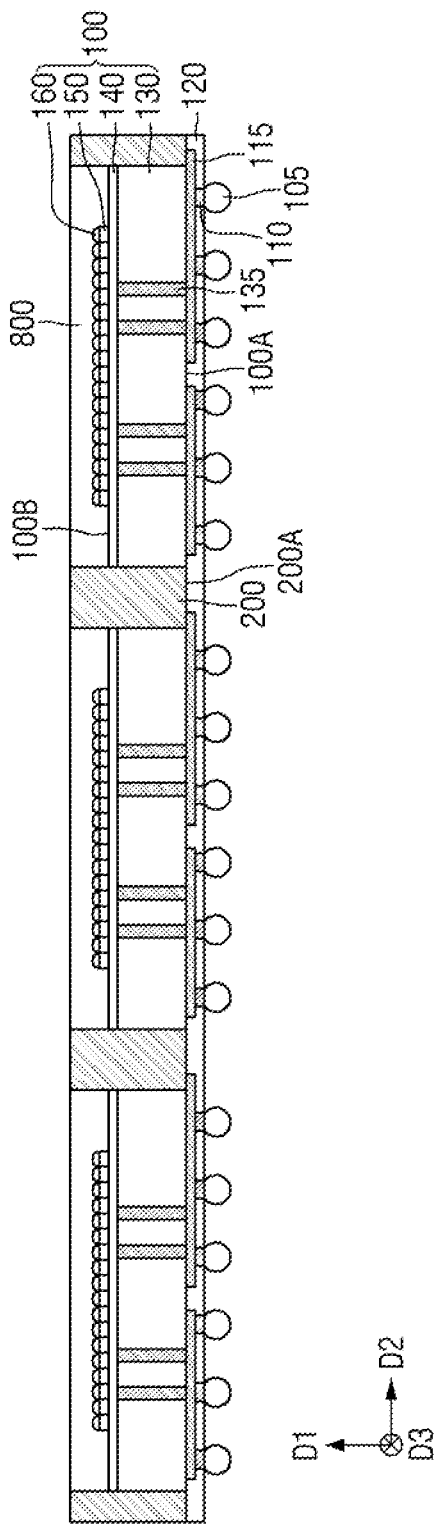

Referring to FIG. 15, the silicon carrier 900 may be removed.

The silicon carrier 900 may be removed to expose the fourth face 200B of the mold layer 200. Also, the silicon carrier 900 may be removed to expose the sacrificial layer 800.

Figure 16:
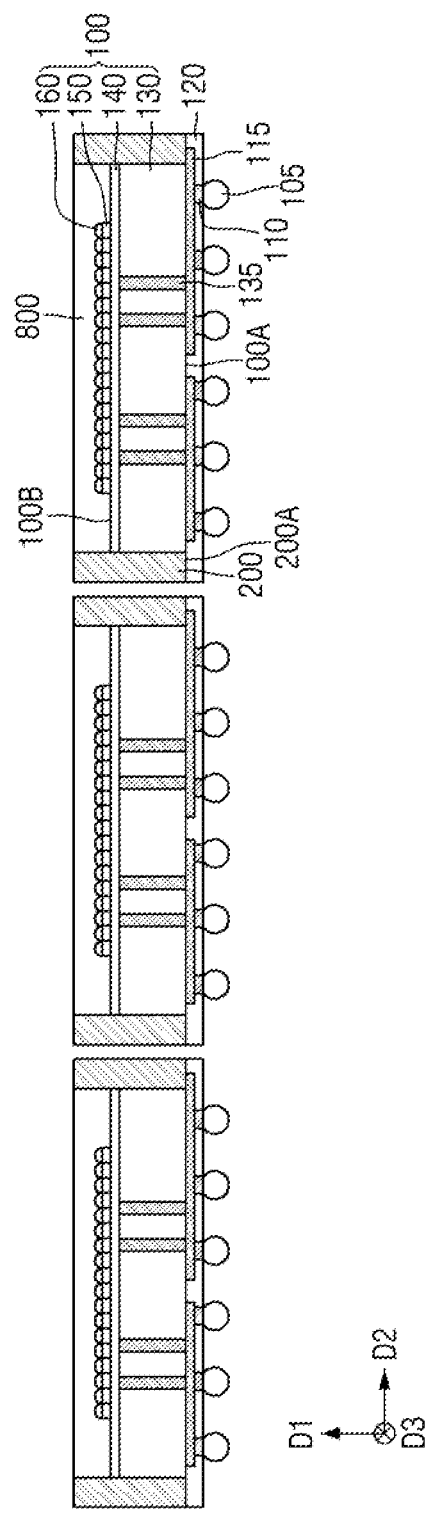

Referring to FIG. 16, the mold layer 200 may be etched. The mold layer 200 may be sawed.

The mold layer 200 may be cut to form a plurality of image sensor chips 100. Each image sensor chip 100 may be an image sensor chip included in an image sensor package according to embodiments of the present inventive concept.

Figure 17:
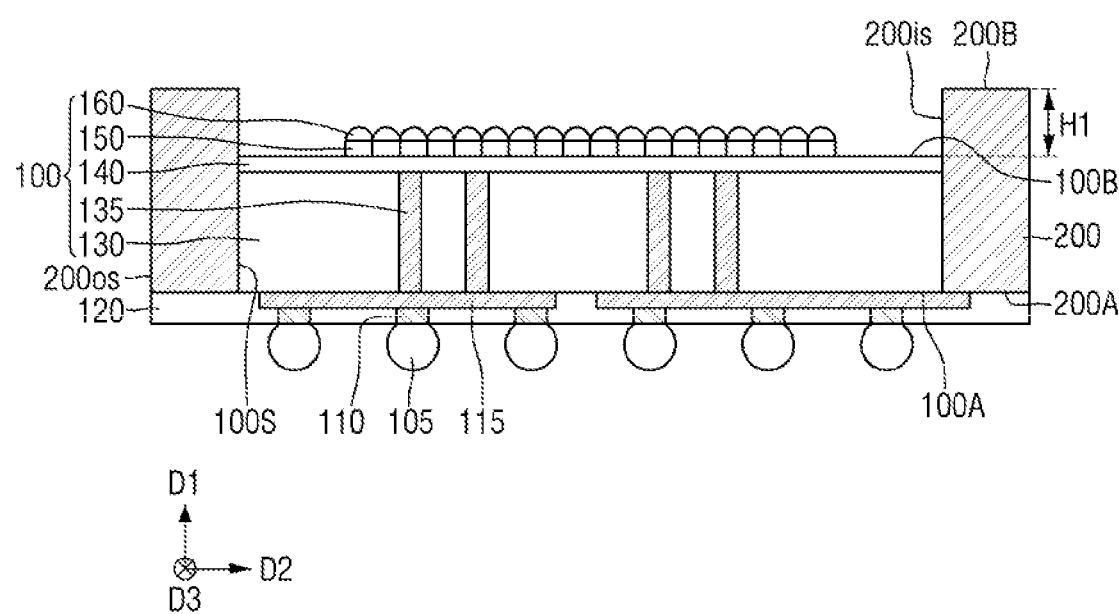

Referring to FIG. 17, the sacrificial layer 800 may be removed.

The sacrificial layer 800 may be removed to expose the second face 200B of the image sensor chip 100. Also, the microlens 160 may be exposed.

The fourth face 200B of the mold layer 200 and the second face 100B of the image sensor chip 100 may be spaced apart from each other in the first direction D1. That is, the second face 100B of the image sensor chip 100 may be lower than the fourth face 200B of the mold layer 200.

A height H1 between the fourth face 200B of the mold layer 200 and the second face 200B of the image sensor chip 100 may be 50 μm or more and 200 μm or less. The height H1 from the second face 100B of the image sensor chip 100 to the fourth face 200B of the mold layer 200 may be 100 μm.

A flare phenomenon may be reduced due to a level difference between the mold layer 200 and the image sensor chip 100. Further, a ghost risk may be reduced due to the level difference between the image sensor chip 100 and the mold layer 200.

Figure 18:
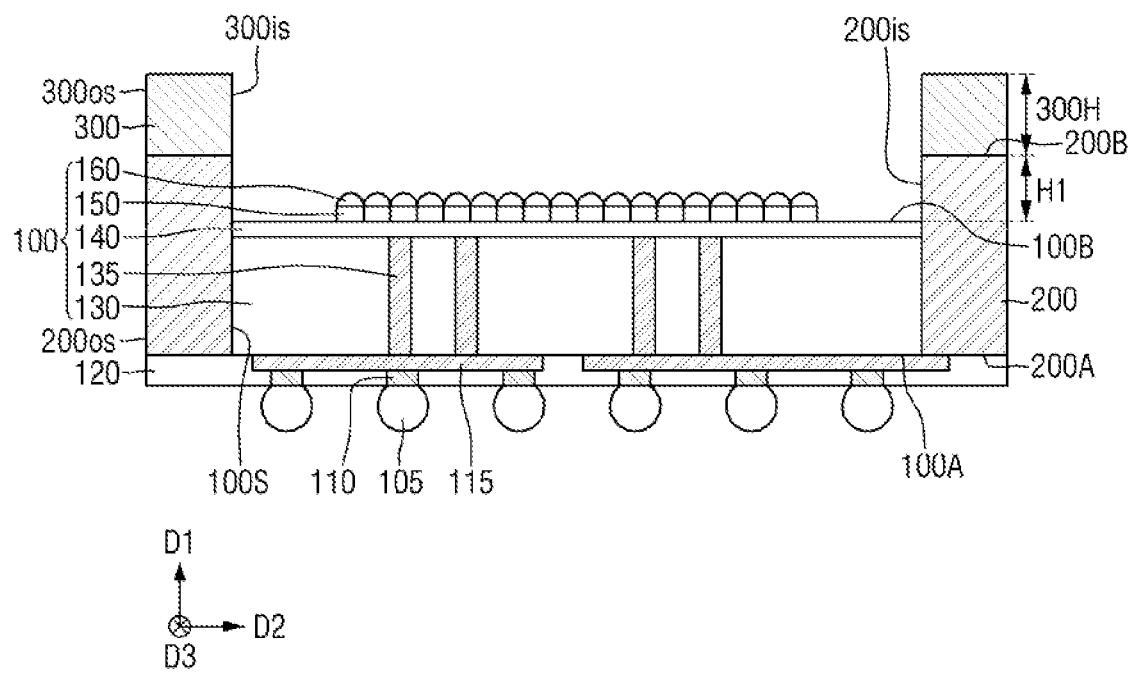

Referring to FIG. 18, an adhesive layer 300 may be formed on the mold layer 200.

The adhesive layer 300 may bond a transparent substrate 400 to be described later. A width of the adhesive layer 300 in the second direction D2 may be the same as a width of the mold layer 200 in the second direction D2.

The adhesive layer 300 may have a height 300H in the first direction D1. The height 300H of the adhesive layer 300 in the first direction D1 may be at least 20 μm or more. The height 300H of the adhesive layer 300 in the first direction D1 may be 20 μm or more and 50 μm or less.

Figure 19:
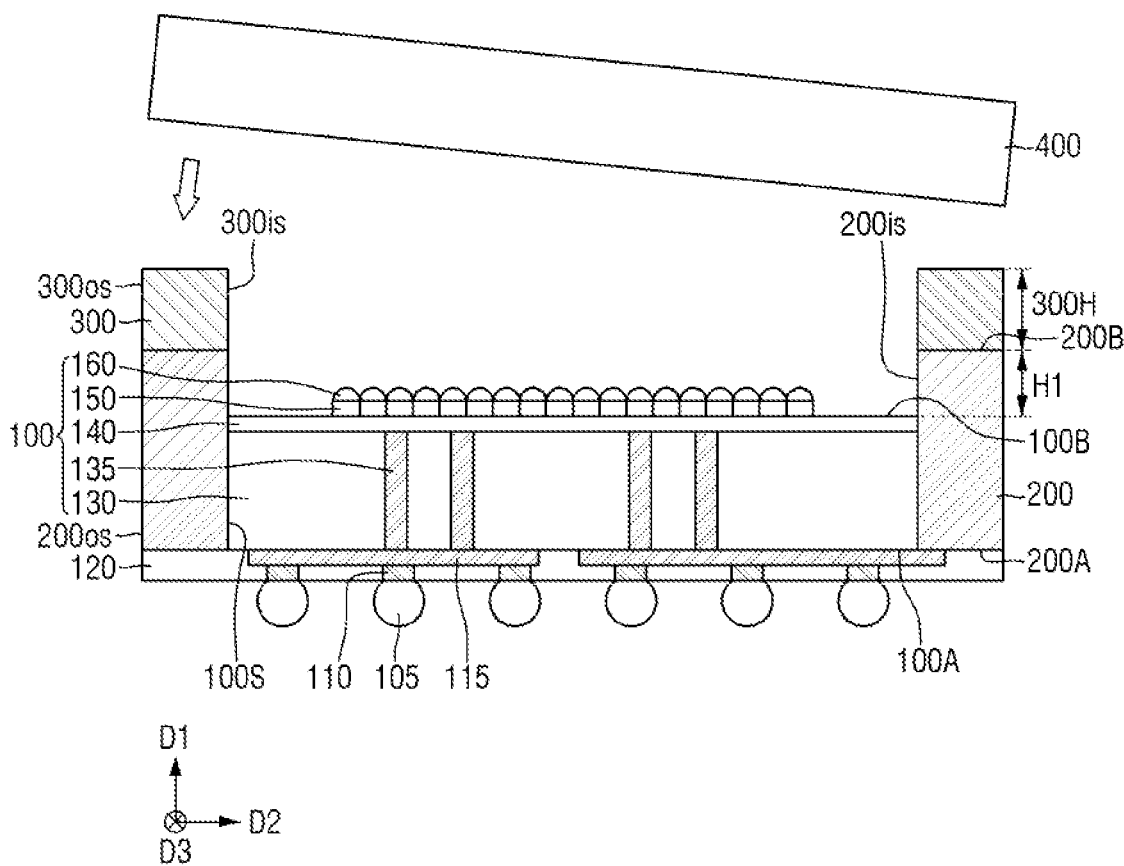

Referring to FIG. 19, the transparent substrate 400 may be attached. The transparent substrate 400 may be brought into contact with and bonded to the adhesive layer 300.

The transparent substrate 400 may include a second portion (e.g., 400_2 of FIG. 2) that is bonded to the adhesive layer 300, and a first portion (e.g., 400_1 of FIG. 2) that is not bonded to the adhesive layer 300.

Although not shown, the first portion of the transparent substrate 400, the image sensor chip 100, the mold layer 200, and the adhesive layer 300 may define a cavity (e.g., CV of FIG. 2).

In concluding the detailed description, those skilled in the art will appreciate that many variations and modifications may be made to embodiments without substantially departing from the principles of the present inventive concept. Therefore, disclosed embodiments of the of the present inventive concept are used in a generic and descriptive sense only and not for purposes of limitation.

What is claimed is:

1. An image sensor package comprising:
   an image sensor chip including:
      first and second faces that are opposite to each other; and
      side walls connecting the first and second faces;
   a mold layer disposed on the side walls of the image sensor chip and including third and fourth faces that are opposite to each other;
   a transparent substrate disposed on the second face of the image sensor chip and spaced apart from the image sensor chip in a first direction, the transparent substrate including a first portion that overlaps the image sensor chip in the first direction and a second portion that does not overlap the image sensor chip in the first direction; and
   an adhesive layer disposed between the mold layer and the second portion of the transparent substrate, wherein the side walls of the image sensor chip overlap the mold layer in a second direction intersecting the first direction, and the fourth face of the mold layer does not overlap the image sensor chip in the first direction.

2. The image sensor package of claim 1, wherein the first face of the image sensor chip is disposed on a same plane as the third face of the mold layer.

3. The image sensor package of claim 2, wherein the second face of the image sensor chip is lower than the fourth face of the mold layer.

4. The image sensor package of claim 3, wherein a height in the first direction between the second face of the image sensor chip and the fourth face of the mold layer is 50 μm or more and 200 μm or less.

5. The image sensor package of claim 1, wherein the transparent substrate includes a fifth face facing the second face of the image sensor chip and a sixth face that is opposite to the fifth face, and wherein the image sensor package further comprises a cavity defined by the fifth face of the transparent substrate, the second face of the image sensor chip, an inner wall of the mold layer, and an inner wall of the adhesive layer.

6. The image sensor package of claim 1, wherein the image sensor chip includes:

a first substrate layer including a through electrode; and a second substrate layer disposed on the first substrate layer and including a photoelectric conversion layer, wherein the through electrode penetrates the first substrate layer and is electrically connected to the photoelectric conversion layer.

7. The image sensor package of claim 6, further comprising:

a solder resist layer disposed on the first face of the image sensor chip and that wraps around a redistribution layer and a connection pad, wherein the redistribution layer and the connection pad are electrically connected to the through electrode.

8. The image sensor package of claim 7, further comprising:

a solder bump disposed on the connection pad and electrically connected to the connection pad.

9. The image sensor package of claim 7, wherein at least a part of the solder resist layer overlaps the mold layer in the first direction.

10. The image sensor package of claim 1, wherein a height of the adhesive layer in the first direction is 20 μm or more and 50 μm or less.

11. An image sensor package comprising:

a solder resist layer that wraps around a redistribution layer and a connection pad;

a mold layer disposed on the solder resist layer and including an inner wall and an outer wall opposite to the inner wall, the inner wall of the mold layer defining a sensor array region;

an image sensor chip disposed on the solder resist layer and in the sensor array region, and contacting the mold layer;

a transparent substrate spaced apart from the image sensor chip in a first direction; and an adhesive layer disposed between the transparent substrate and the mold layer, wherein the mold layer includes a third face and a fourth face that are opposite to each other and that connect the inner wall of the mold layer and the outer wall of the mold layer, and the fourth face of the mold layer does not overlap the image sensor chip in the first direction.

12. The image sensor package of claim 11, wherein the image sensor chip includes a first face and a second face that are opposite to each other, and the first face of the image sensor chip is disposed on a same plane as the third face of the mold layer.

13. The image sensor package of claim 12, wherein the second face of the image sensor chip is lower than the fourth face of the mold layer.

14. The image sensor package of claim 13, wherein a height in the first direction between the second face of the image sensor chip and the fourth face of the mold layer is 50 μm or more and 200 μm or less.

15. The image sensor package of claim 11, wherein at least a part of the solder resist layer overlaps the mold layer in the first direction.

16. The image sensor package of claim 11, wherein a height of the adhesive layer in the first direction is 20 μm or more and 50 μm or less.

17. The image sensor package of claim 11, wherein the transparent substrate includes a fifth face facing the second face of the image sensor chip and a sixth face that is opposite to the fifth face, and the image sensor package further comprises a cavity defined by the fifth face of the transparent substrate, the second face of the image sensor chip, the inner wall of the mold layer, and the inner wall of the adhesive layer.

18. An image sensor package comprising:

an image sensor chip including:

a first face on which a redistribution layer is formed and a second face that is opposite to the first face and on which a photoelectric conversion layer is formed; and side walls that connect the first and second faces;

a solder resist layer disposed on the first face of the image sensor chip and that wraps around the redistribution layer and a connection pad on the redistribution layer;

a mold layer disposed on the side walls of the image sensor chip and including:

a third face disposed on a same plane as the first face of the image sensor chip; and a fourth face opposite to the third face;

a transparent substrate disposed on the second face of the image sensor chip and spaced apart from the image sensor chip in a first direction, the transparent substrate including a first portion that overlaps the image sensor chip in the first direction and a second portion that does not overlap the image sensor chip in the first direction;

an adhesive layer disposed between the second portion of the transparent substrate and the fourth face of the mold layer; and a solder bump disposed on the connection pad and electrically connected to the redistribution layer and the connection pad, wherein the image sensor chip includes:

a first substrate layer including a through electrode; and a second substrate layer disposed on the first substrate layer and including the photoelectric conversion layer, wherein the through electrode penetrates the first substrate layer and electrically connects the redistribution layer and the photoelectric conversion layer, wherein the side walls of the image sensor chip overlap the mold layer in a second direction intersecting the first direction, and wherein the fourth face of the mold layer does not overlap the first substrate layer in the first direction.

19. The image sensor package of claim 18, wherein a height in the first direction between the second face of the image sensor chip and the fourth face of the mold layer is 50 µm or more and 200 µm or less.

20. The image sensor package of claim 18, wherein at least a part of the solder resist layer overlaps the mold layer in the first direction.

\* \* \* \* \*